Figure 1A:
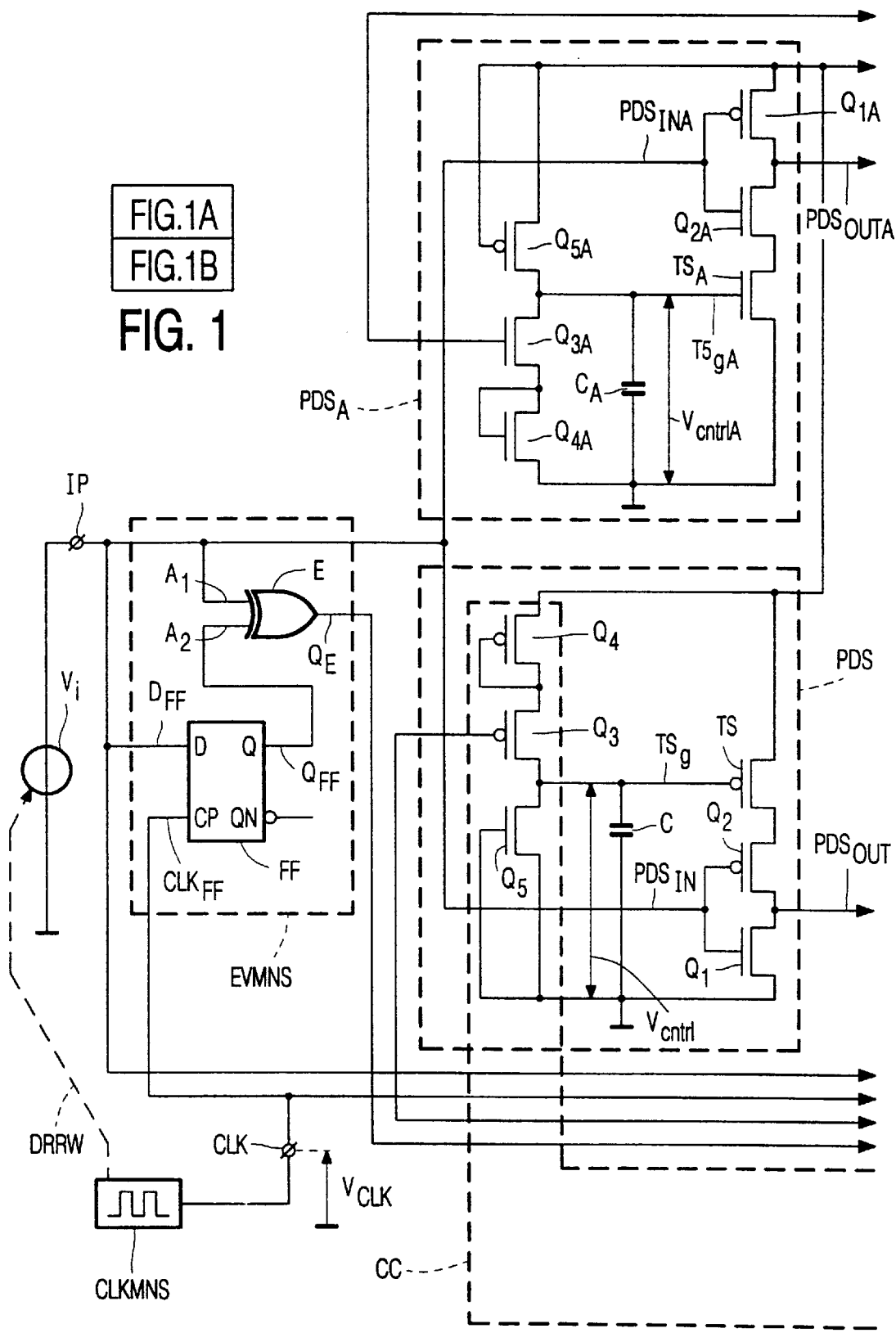

United States Patent [19]
Labram

[11] Patent Number: 6,081,134
[45] Date of Patent: Jun. 27, 2000

[54] OUTPUT STAGE WITH SELF CALIBRATING SLEW RATE CONTROL

[75] Inventor: Steven M Labram, Crolles, France

[73] Assignee: U.S. Philips Corporation, New York, N.Y.

[21] Appl. No.: 09/213,525

[22] Filed: Dec. 17, 1998

[30] Foreign Application Priority Data

Dec. 23, 1997 [EP] European Pat. Off. .............. 97403136

[51] Int. Cl.$^7$ ........................ H03K 17/16; H03K 19/003; H03K 19/0175; H03K 5/12
[52] U.S. Cl. ............................... 326/83; 326/27; 326/28; 327/108; 327/170
[58] Field of Search ................................. 326/83, 26, 27, 326/28; 327/108, 170

[56] References Cited

U.S. PATENT DOCUMENTS 4,972,101  11/1990  Partovi et al. .
5,748,019   5/1998  Wong et al. .............................. 327/170

*Primary Examiner*—Michael Tokar
*Assistant Examiner*—Daniel D. Chang
*Attorney, Agent, or Firm*—Brian J. Wieghaus

[57] ABSTRACT

Output stage with self calibrating slew rate control. An output stage comprising a first (1) and a second (2) supply terminal for receiving a supply voltage (SV); a pre-drive circuit (PDS) coupled to an input terminal (IP) for receiving an input signal ($V_i$), the pre-drive circuit (PDS) comprising a series transistor (TS) with a control electrode ($TS_g$) for receiving a control voltage ($V_{cntrl}$) for controlling a maximum current from an output ($PDS_{OUT}$) of the pre-drive circuit (PDS), and a capacitor (C) for retaining the control voltage ($V_{cntrl}$); an output-drive circuit (ODS) for delivering an output signal ($V_o$) at an output terminal (OP) in response to the input signal ($V_i$); and a control circuit (CC) for delivering the control voltage ($V_{cntrl}$). The output stage further comprises a control circuit (CC) which is coupled between the output terminal (OP) and the control electrode ($TS_g$). The pre-drive circuit (PDS) and the output-drive circuit (ODS) together form a non-inverting output stage. If the slew rate of the output signal ($V_o$) is too large it will gradually be reduced by adapting the control voltage ($V_{cntrl}$) The control circuit CC, the pre-drive circuit (PDS), and the output-drive circuit (ODS) together form a clocked feedback loop in order to automatically calibrate the slew rate of the output signal ($V_o$) during a few clock cycles.

7 Claims, 5 Drawing Sheets

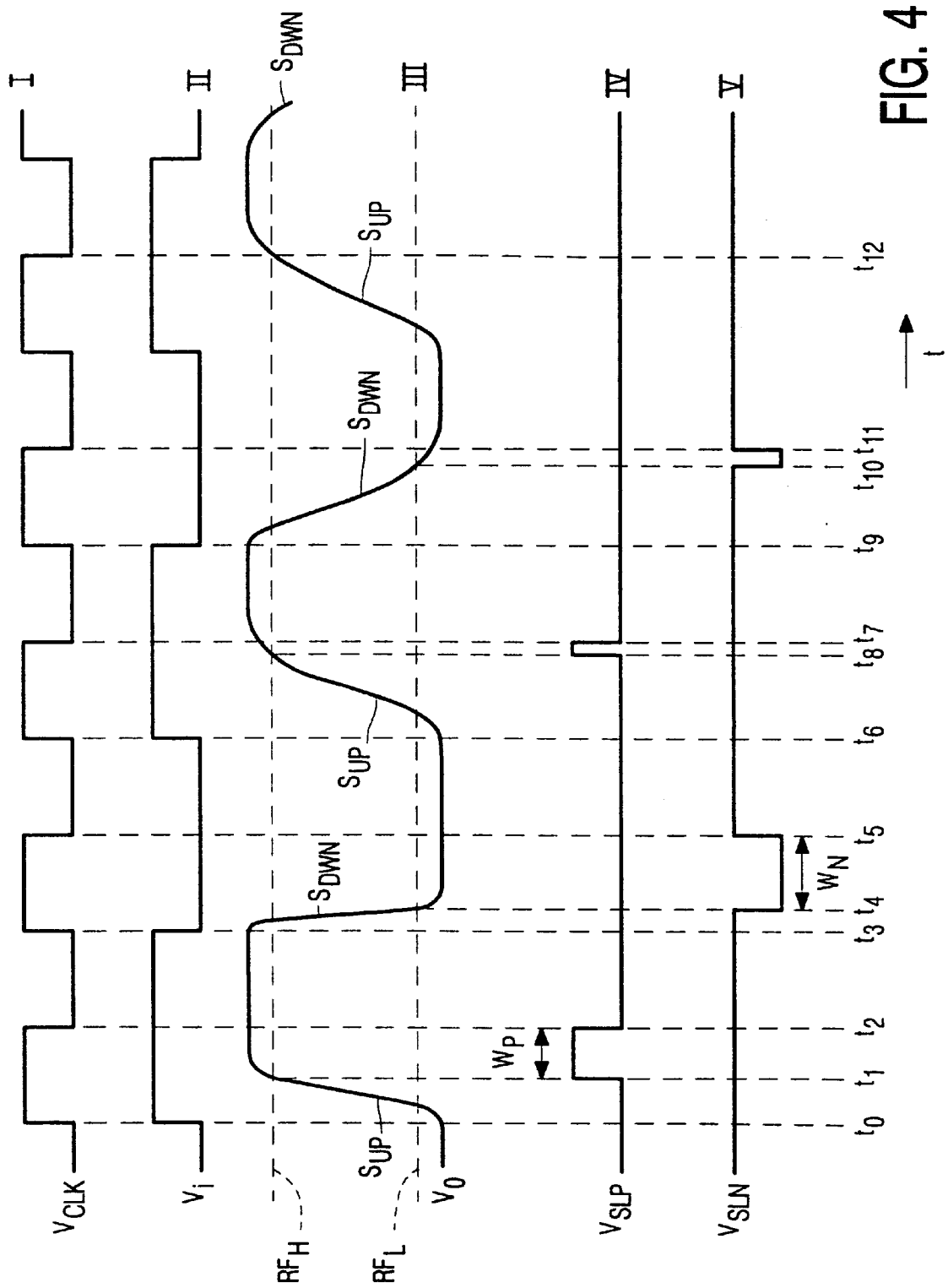

OUTPUT STAGE WITH SELF CALIBRATING SLEW RATE CONTROL

The invention relates to an output stage comprising a first and a second supply terminal for receiving a supply voltage; a pre-drive circuit coupled to an input terminal for receiving an input signal, the pre-drive circuit comprising a series transistor with a control electrode for receiving a control voltage for controlling a maximum current from an output of the pre-drive circuit, and a capacitor for retaining the control voltage; an output-drive circuit for delivering an output signal at an output terminal in response to the input signal; and a control circuit for delivering the control voltage.

Such an output stage is known from U.S. Pat. No. 4,972,101. In this known output stage the maximum current which can be drawn from the output of the pre-drive circuit is limited and as a consequence the rate of change of the output signal is limited as well. This is done to limit the rate of change of current through the first supply terminal and thus also limit the rate of change of current through the output terminal (when a load is coupled with the output terminal). The limitation of the rate of change through the first supply terminal and/or the output terminal is needed to reduce parasitic voltage spikes at the first supply terminal and/or at the output terminal caused by parasitic inductances in series with the first supply terminal and/or in series with the output terminal. In the known output stage the control circuit comprises a dummy output stage and a buffer stage. The dummy output stage supplies, via the buffer stage, the control voltage. Especially when applied in an integrated circuit the addition of the dummy output stage is by itself disadvantageous because of the relatively large amount of extra chip-area needed. In the aforementioned patent the dummy output stage is provided with several capacitors. Also these capacitors increase the needed chip-area. Further the presence of the buffer stage also increases the needed chip-area considerably. A further drawback of the known output stage is that the accuracy of the control voltage is dependent on matching between components in the control circuit and components in other parts of the output stage.

It is an object of the invention to provide an improved output stage which eliminates the above mentioned drawbacks.

To this end, according to the invention, the output stage of the type defined in the opening paragraph is characterized in that the control circuit is coupled between the output terminal and the control electrode. With this it is accomplished that the control voltage is dependent on the rate of change of the output signal. In fact the slew rate of the output signal is calibrated by the output stage itself. An advantage of this is that no accurate matching of components is required between components in the control circuit and components in other parts of the output stage.

An embodiment of an output stage according to the invention may be characterized in that the control circuit CC comprises level detecting means LDMNS for delivering at least one digital signal dependent on a level of the output signal. The digital level is used to determine whether the control voltage must be adapted or not.

Another embodiment of an output stage according to the invention may be characterized in that the output stage comprises means for delivering a clock signal during a first clock edge of the clock signal; and in that the control circuit comprises means for adapting the control voltage in dependency of the at least one digital signal, the adapting of the control voltage being triggered by the first or a second clock edge of the clock signal. By doing so the control voltage is adapted in a synchronized way in respect of the input signal. This makes it more easy to adapt the control voltage in a proper way.

Yet another embodiment of an output stage according to the invention may be characterized in that the pre-drive circuit comprises means for discharging or charging the capacitor. By this a leakage path for the capacitor is provided so that under DC conditions the capacitor is fully discharged (or charged), and the series transistor is fully turned on. With this the output stage has a fail safe mode of operation in that the natural tendency of the slew rate of the output signal is maximal. By this the output stage always starts with a maximal slew rate of the output signal just after the start-up of the output stage. With this a valid output signal can be generated at the output terminal as soon as possible. After the end of the start-up of the output stage the control voltage will be adapted in order to reduce the slew rate of the output signal and thereby reducing the parasitic voltage spikes at the first supply terminal and/or at the output terminal. If for some reason the control voltage is adapted too much (overcompensation) during normal operation, that is to say not during the start-up of the output stage, then over time the leakage path will pull back the control voltage to its correct value.

A further embodiment of an output stage according to the invention may be characterized in that the output stage comprises evaluation means for delivering a digital evaluation signal for avoiding the control voltage being adapted when the input signal has not changed during a next clock cycle of the clock signal. With this an undesirable change of the control voltage is avoided.

Figure 1B:
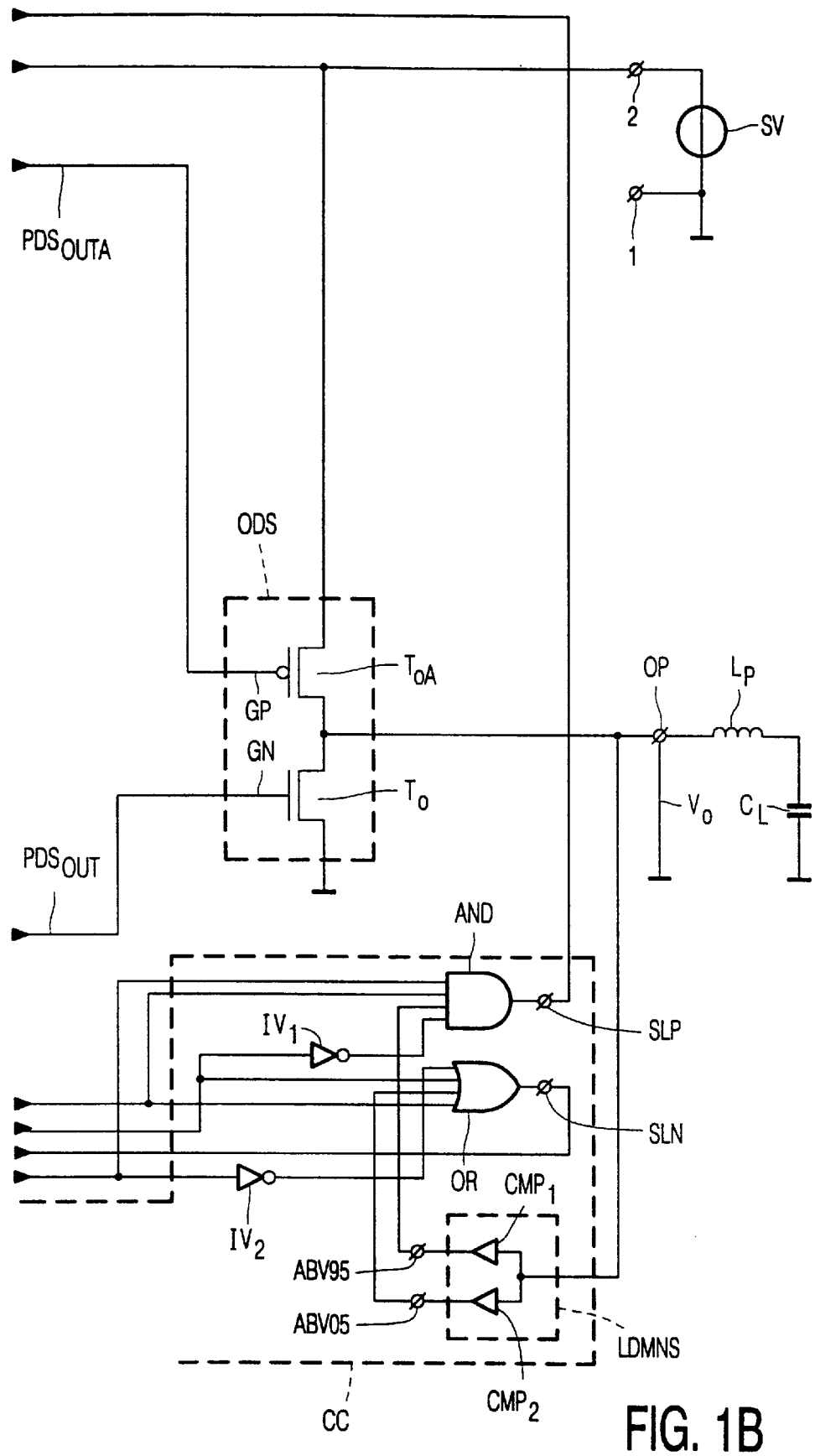
Figure 2:
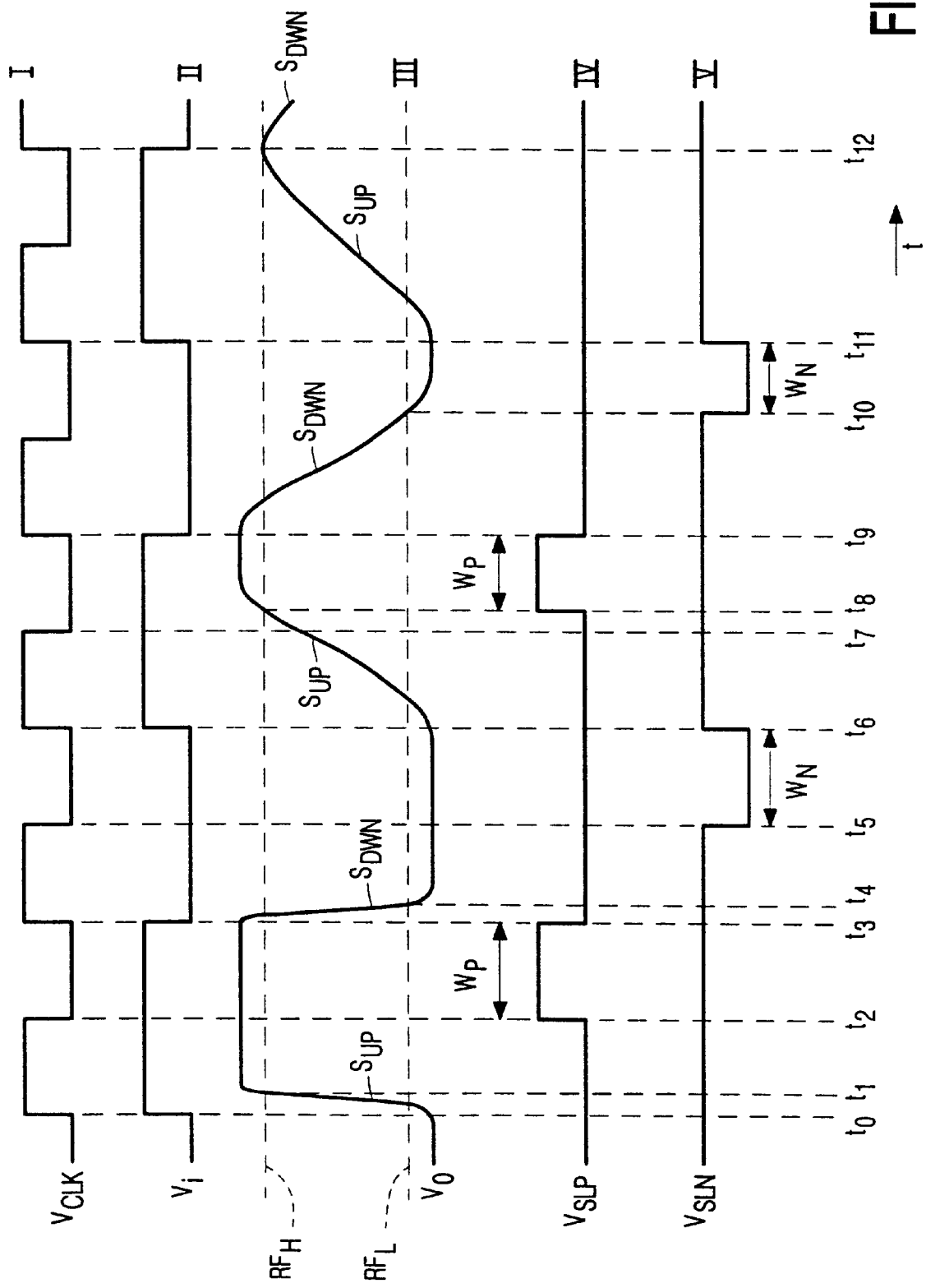
Figure 3:
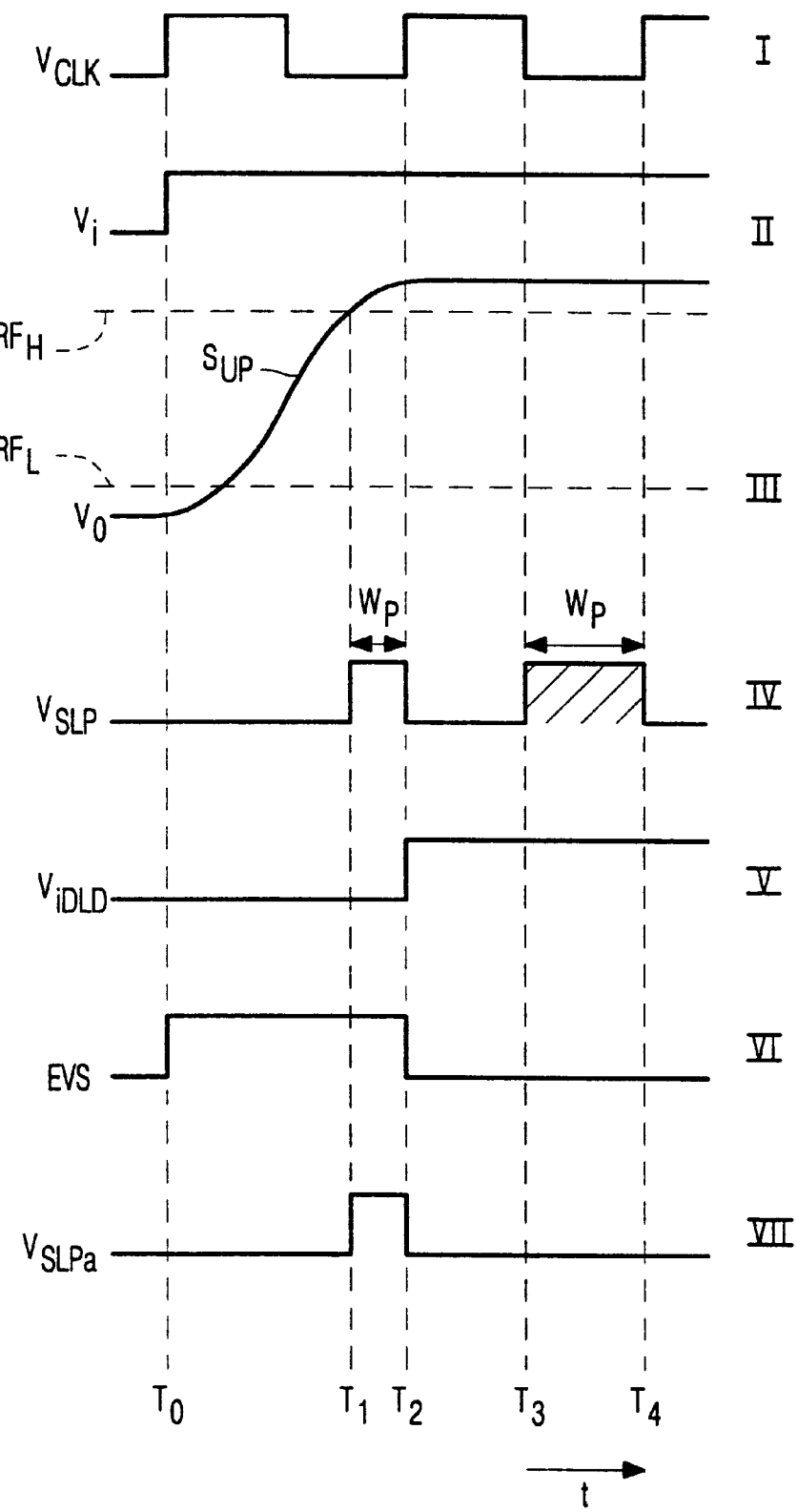

The invention will be described in more detail with reference to the accompanying drawings, in which:

FIG. 1 is a circuit diagram of an embodiment of an output stage in accordance with the invention; and FIGS. 2, 3 and 4 are sets of diagrams showing signals in order to better explain the output stage shown in FIG. 1.

In these Figures parts or elements having like functions or purposes bear the same reference symbols.

FIG. 1 is a circuit diagram of an embodiment of an output stage in accordance with the invention. The output stage comprises an input terminal IP for receiving an input signal $V_i$ and an output terminal OP for delivering an output signal $V_o$. A supply voltage SV is connected between a first supply terminal 1 and a second supply terminal 2. A load, implemented with a load capacitor $C_L$, is connected between the output terminal OP and the first supply terminal 1. A parasitic inductance $L_p$ is shown in series with the load capacitor $C_L$. The parasitic inductance $L_p$ will cause relatively large voltage spikes at the output terminal OP if the slew rate of the output signal $V_o$ is relatively large. Like the parasitic inductance $L_p$ in series with the output terminal OP also other parasitic inductances in series with the first supply terminal 1 or the second supply terminal 2 can cause relatively large voltage spikes at the first supply terminal 1 and the second supply terminal 2, respectively. By way of example the invention only describes the reduction of the voltage spikes at the output terminal OP due by the parasitic inductance $L_p$, but the invention also reduces the voltage spikes at the first and the second supply terminals 1,2 in a similar way.

The output stage further comprises an output drive circuit ODS, a pre-drive circuit PDS, a further pre-drive circuit $PDS_A$, a control circuit CC, evaluation means EVMNS, and means CLKMNS for delivering a clock signal $V_{CLK}$ at a clock terminal CLK. The input signal $V_i$ is a clocked signal. This is indicated by the dashed arrow DRRW.

The output drive circuit ODS comprises a field effect transistor $T_0$ and a further field effect transistor $T_{0A}$. The first field effect transistor $T_0$ comprises a gate GN, a source connected to the first supply terminal 1, and a drain connected to the output terminal OP; and the further field effect transistor $T_{0A}$ comprises a gate GP, a source connected to the second supply terminal 2, and a drain connected to the output terminal OP.

The pre-drive circuit PDS is connected via an output $PDS_{OUT}$ to the gate GN of the field effect transistor $T_0$, and with a input $PDS_{IN}$ to the input terminal IP. The pre-drive circuit PDS comprises first, second, third, fourth, and fifth transistors $Q_1$, $Q_2$, $Q_3$, $Q_4$, $Q_5$; a series transistor TS; and a capacitor C. The first and second transistors $Q_1$, $Q_2$ both have an input electrode connected to each other, in that way constituting the input $PDS_{IN}$ of the pre-drive circuit PDS. The first and second transistors $Q_1$, $Q_2$ both have a first main electrode connected to each other, in that way constituting the output $PDS_{OUT}$ of the pre-drive circuit PDS. A second main electrode of the first transistor $Q_1$ is connected to the first supply terminal 1. The series transistor TS comprises a control electrode $TS_g$, and a main current path coupled between the second supply terminal 2 and a second main electrode of the second transistor $Q_2$. The capacitor C is connected between the control electrode $TS_g$ and the first supply terminal 1. The third transistor $Q_3$ has an input electrode, a first main electrode connected to the control electrode $TS_g$, and a second main electrode. The fourth transistor $Q_4$ is arranged as a diode configuration between the second supply terminal 2 and the second main electrode of the third transistor $Q_3$. The fifth transistor $Q_5$ is arranged, as means for discharging the capacitor C, between the control electrode $TS_g$ and the first supply terminal 1. Though not excluded, the fifth transistor $Q_5$ is generally not implemented as a diode configuration because a diode configuration would discharge the capacitor C too rapid. More appropriate is that the fifth transistor $Q_5$ is, for instance, implemented with a bipolar transistor (but a field effect transistor can also be applied) with its base and emitter both connected to the first supply terminal 1, and its collector connected to the control electrode $TS_g$, However any high ohmic impedance across the capacitor C can serve as means for discharging the capacitor C.

The further pre-drive circuit $PDS_A$ is connected via an output $PDS_{OUT}$ to the gate GP of the further field effect transistor $T_{0A}$, and with a input $PDS_{INA}$ to the input terminal IP. The further pre-drive circuit $PDS_A$ comprises sixth, seventh, eighth, ninth, and tenth transistors $Q_{1A}$, $Q_{2A}$, $Q_{3A}$, $Q_{4A}$, $Q_{5A}$; a further series transistor $TS_A$; and a further capacitor $C_A$. The sixth and seventh transistors $Q_{1A}$, $Q_{2A}$ both have an input electrode connected to each other, in that way constituting the input $PDS_{INA}$ of the further pre-drive circuit $PDS_A$. The sixth and seventh transistors $Q_{1A}$, $Q_{2A}$ both have a first main electrode connected to each other, in that way constituting the output $PDS_{OUTA}$ of the further pre-drive circuit $PDS_A$. A second main electrode of the first transistor $Q_{1A}$ is connected to the second supply terminal 2. The series transistor $TS_A$ comprises a further control electrode $TS_{gA}$, and a main current path coupled between a second main electrode of the second transistor $Q_2$ and the first supply terminal 1. The further capacitor $C_A$ is connected between the control electrode $TS_{gA}$ and the first supply terminal 1. The eighth transistor $Q_{3A}$ has an input electrode, a first main electrode connected to the further control electrode $TS_{gA}$, and a second main electrode. The ninth transistor $Q_{4A}$ is arranged as a diode configuration between the second main electrode of the eighth transistor $Q_{3A}$ and the first supply terminal 1. The tenth transistor $Q_{5A}$ is arranged, for instance in the same way as the fifth transistor $Q_5$, as further means for discharging the further capacitor $C_A$, between the second supply terminal 2 and the further control electrode $TS_{gA}$.

It is to be noticed that the third, fourth, and fifth transistors $Q_3$, $Q_4$, $Q_5$ form a common part of the pre-drive circuit PDS and the control circuit CC.

The control circuit CC further comprises means LDMNS for delivering at least one digital signal having a digital level dependent on a level of the output signal $V_o$. The means LDMNS comprises a first comparator $CMP_1$ and a second comparator $CMP_2$. All kind of comparators, such as inverter stages, can be used for the first and second comparators $CMP_1$, $CMP_2$. An input of the first comparator $CMP_1$ is connected to the output terminal OP, an output of the first comparator $CMP_1$ is connected to a first control terminal ABV95. An input of the second comparator $CMP_2$ is connected to the output terminal OP, an output of the second comparator $CMP_2$ is connected to a second control terminal ABV05. The comparator $CMP_1$ is dimensioned in such a way that when the level of the output signal $V_o$. exceeds a high reference level $RF_H$, for example 95% of the supply voltage SV, the signal at the first control terminal ABV95 will become logic "high". Analogous to comparator $CMP_1$, comparator $CMP_2$ is dimensioned in such a way that when the level of the output signal $V_o$ exceeds a low reference level RFL, for example 5% of the supply voltage SV, the signal at the second control terminal ABV05 will become logic "high". The control circuit CC also comprises a logic and-gate AND with a first, a second, a third and, a fourth input, and an output connected to a third control terminal SLP; and a logic or-gate OR with a first, a second, a third and a fourth input, and an output connected to a fourth control terminal SLN; a first inverter $IV_1$ with an input and an output; and a second inverter $IV_2$ with an input and an output.

The evaluation means EVMNS comprises a flip-flop FF with a data input $D_{FF}$ which is connected to the input terminal IP, a clock input $CLK_{FF}$ connected to the clock terminal CLK, and an output $Q_{FF}$; and an exclusive or-gate E with a first input $A_1$ connected to the input terminal IP, a second input $A_2$ connected to the output $Q_{FF}$ of the flip-flop FF, and an output $Q_E$ connected to the first input of the and-gate AND, and connected to the input of the second inverter $IV_2$.

The second input of the and-gate AND, and the fourth input of the or-gate OR are connected to the input terminal IP. The second input of the or-gate OR, and the input of the first inverter $IV_1$ are connected to the clock terminal CLK. The output of the first inverter $IV_1$ is connected to the fourth input of the and-gate AND. The third input of the and-gate AND is connected to the first control terminal ABV95. The third input of the or-gate OR is connected to the second control terminal ABV05. The output of the second inverter $IV_2$ is connected to the first input of the or-gate OR. The input electrode of the third transistor $Q_3$ is connected to the fourth control terminal SLN. The input electrode of the eight transistor $Q_{3A}$ is connected to the third control terminal SLP.

In FIG. 2 diagrams I, II, III, IV and V represent respectively the clock signal $V_{CLK}$, the input signal $V_i$, the output signal $V_o$, a first slew rate control signal $V_{SLP}$ at the third control terminal SLP, and a second slew rate control signal $V_{SLN}$ at the fourth control terminal SLN.

The operation of the field effect transistor $T_0$ and the further field effect transistor $T_{0A}$ are complementary that is to say that when the output signal $V_0$ changes from logic "high" to logic "low" the field effect transistor $T_0$ will be conducting whereas the further field effect transistor $T_{0A}$ will be non-conducting. The reverse will happen when the output signal $V_0$ changes from logic "low" to logic "high". The elements of the following pairs have a mutual similar operation:

$T_0/T_{0A}$, GN/GP, PDS/PDS$_A$, PDS$_{IN}$/PDS$_{INA}$, PDS$_{OUT}$/PDS$_{OUTA}$,
C/C$_A$, TS/TS$_A$, TS$_g$/TS$_{gA}$, $Q_1/Q_{1A}$, $Q_2/Q_{2A}$, $Q_3/Q_{3A}$, $Q_4/Q_{4A}$, $Q_5/Q_{5A}$, $V_{SLN}/V_{SLP}$, $S_{DWN}/S_{UP}$, $W_N/W_P$, $RF_L/RF_H$, $V_{cntrl}/V_{cntrlA}$.

The operation of the output stage is as follows. To begin with assume that the input signal $V_i$ changes every time when the clock signal $V_{CLK}$ changes from a logic "low" to a logic "high" level as indicated in FIG. 2. As a consequence, as will be explained later, an evaluation signal EVS (see FIG. 3) at the output $Q_E$ of the exclusive orgate E is logic "high". Because the pre-drive circuit PDS is an inverting amplifier, the signal at the output PDS$_{OUT}$ of the pre-driver circuit PDS has an opposite phase with respect to the input signal $V_i$. However since the output drive circuit ODS is also an inverting amplifier the output signal $V_o$ has the same phase with respect to the input signal $V_i$. Thus in the time interval $t_0$–$t_1$ the output signal $V_o$ changes from logic "low" to logic "high". The up going slopes of the output signal $V_o$ are indicated by $S_{UP}$ (for instance in the time interval $t_0$–$t_1$). The down going slopes of the output signal $V_o$ are indicated by $S_{DWN}$ (for instance in the time interval $t_3$–$t_4$). Let us (for the time being) leave out of consideration the down going slopes $S_{DWN}$, the second slew rate control signal $V_{SLN}$, and a control voltage $V_{cntrl}$ across the capacitor C because they have similar functions as the up going slopes $S_{UP}$, the first slew rate control signal $V_{SLP}$, and a further control voltage $V_{cntrlA}$ across the further capacitor $C_A$, respectively. The up going slope $S_{UP}$ is considered to be too steep in the time interval $t_0$–$t_1$ and must thus be reduced in order to reduce parasitic voltage spikes at the output terminal OP caused by the parasitic inductance $L_p$ in series with the output terminal OP. This is done by adapting the further control voltage $V_{cntrlA}$ during a certain time interval when the clock signal $V_{CLK}$ is logic "low". The first slew rate control signal $V_{SLP}$ is only logic "high" when the level of the output signal $V_o$ is higher than the high reference level $RF_H$ and when the clock signal $V_{CLK}$ is at the same time logic "low". At time $t_2$ the clock signal VCLK becomes logic "low" and since the level of the output signal $V_o$ is already higher than the high reference level $RF_H$, the first slew rate control signal $V_{SLP}$ becomes logic "high". The first slew rate control signal $V_{SLP}$ stays logic "high" up to time $t_3$ because then the clock signal $V_{CLK}$ becomes logic "high" again. The pulse width $W_P$ of the first slew rate control signal $V_{SLP}$ is defined as the duration of time in which the first slew rate control signal VSLP is logic "high". Since during the time interval $t_2$–$t_3$ the first slew rate control signal $V_{SLP}$, at the third control terminal SLP, is logic "high" the eighth transistor $Q_{3A}$ is conducting. As a consequence the further capacitor $C_A$ is, partly, discharged via the eighth transistor $Q_{3A}$ and the ninth transistor $Q_{4A}$. By this the further control voltage $V_{cntrlA}$ across the further capacitor $C_A$ is reduced and as a consequence the transconductance of the further series transistor $TS_A$ is reduced as well. By this a maximum current at the output PDS$_{OUTA}$ of the further pre-drive circuit PDS$_A$ is reduced. As a consequence the gate-source capacitance of the further field effect transistor $T_{0A}$ will be charged less rapidly when the output signal $V_o$ has to change from logic "low" to logic "high" again. For this reason the up going slope $S_{UP}$ in the time interval $t_6$–$t_8$ is less steep than in the time interval $t_0$–$t_1$. Therefore when the clock signal $V_{CLK}$ changes from logic "high" to logic "low" at time $t_7$ the first slew rate control signal $V_{SLP}$ does not yet change from logic "low" to logic "high" because at time $t_7$ the level of the output signal $V_o$ is still lower than the high reference level $RF_H$. At time $t_8$ the level of the output signal $V_o$ is equal to the high reference level $RF_H$. The first slew rate control signal $V_{SLP}$ becomes logic "high" and stays logic "high" up to time $t_9$ because then the clock signal $V_{CLK}$ becomes logic "high" again. So because the up going slope $S_{UP}$ is less steep in the time interval $t_6$–$t_8$, in respect to the time interval $t_0$–$t_1$, the pulse width $W_P$ in the interval $t_8$–$t_9$ is smaller than it was the case in the time interval $t_2$–$t_3$. Analogous to the case in the time interval $t_2$–$t_3$ the maximum current at the output PDS$_{OUTA}$ of the further pre-drive circuit PDS$_A$ is further reduced. The amount of further reduction of the maximum current at the output PDS$_{OUTA}$ is however less than the reduction earlier in the time interval $t_2$–$t_3$ because of the fact that the pulse width $W_P$ in the interval $t_8$–$t_9$ is smaller than it was the case in the time interval $t_2$–$t_3$. The up going slope $S_{UP}$ in the time interval $t_{11}$–$t_{12}$ is less steep than in the time interval $t_6$–$t_8$. The level of the output signal $V_o$ equals the high reference level $RF_H$ at time $t_{12}$. However at time $t_{12}$ the clock signal $V_{CLK}$ changes from logic "low" to logic "high". For this reason the first slew rate control signal $V_{SLP}$ keeps logic "low". The slope $S_{UP}$ has reached the desired steepness and the first slew rate control signal $V_{SLP}$ will, in principle, stays logic "low".

In FIG. 3 diagrams I, II, III, IV, V, VI, and VII represent respectively the clock signal $V_{CLK}$, the input signal $V_i$, the output signal $V_o$, the first slew rate control signal $V_{SLP}$, a delayed input signal $V_{iDLD}$, the evaluation signal EVS, and an adapted first slew rate control signal $V_{SLPa}$ at the third control terminal SLP.

Until now it has been assumed that the input signal $V_i$ changes every time when the clock signal $V_{CLK}$ changes from a logic "low" to a logic "high" level. In practice this is rarely the case. It often happens that the input signal $V_i$, and as a consequence the output signal $V_o$ as well, does not change for a couple of clock cycles. At time $T_0$ both the clock signal $V_{CLK}$ and the input signal $V_i$ change from logic "low" to logic "high". This causes the output signal $V_o$ to change, gradually, from logic "low" to logic "high". In the time interval $T_1$–$T_2$ the first slew rate control signal $V_{SLP}$ is logic "high", which is in accordance with the time interval $t_8$–$t_9$ as shown in FIG. 2. At time $T_3$ the first slew rate control signal $V_{SLP}$ also becomes logic "high" since the clock signal $V_{CLK}$ becomes logic "low" while the level of the output signal $V_o$ is already higher than the high reference level $RF_H$. This is in accordance with time $t_2$ shown in FIG. 2. However the reason that the level of the output signal $V_o$ is already higher than the high reference level $RF_H$ is not because the up going slope $S_{UP}$ is too steep, as was the case in the time interval $t_0$–$t_1$ as shown in FIG. 2, but because the output signal $V_o$ did not change at time $T_2$. Therefore the "high" logic value of the first slew rate control signal $V_{SLP}$ in the interval $T_3$–$T_4$, which is shown shaded in FIG. 3, is false. For this reason the first slew rate control signal $V_{SLP}$ must be replaced by the adapted slew rate control signal $V_{SLPa}$. This is done with the aid of the evaluation signal EVS. The evaluation signal EVS evaluates the first slew rate control signal $V_{SLP}$. When the evaluation signal EVS is logic "high" the adapted first slew rate control signal $V_{SLPa}$ is equal to the first slew rate control signal $V_{SLP}$, otherwise the first slew rate control signal $V_{SLPa}$ is logic "low". In order to accomplish this the delayed input signal $V_{iDLD}$ at the output $Q_{FF}$ of the flip-flop FF, and thus at the second input $A_2$ of the exclusive or-gate E is compared with the input signal $V_i$ at the first input $A_1$ of the exclusive or-gate E. This results in the evaluation signal EVS at the output $Q_E$ of the exclusive or-gate E.

It is to be noticed that the output stage as described so far attempts to control the up going slope $S_{UP}$ and the down going slope $S_{DWN}$ so that the level of the output signal $V_o$ just reaches the logic "high" or logic "low" level at the end of the clock cycle. This may not be "safe" enough for some applications. A slight modification to the control circuit CC allows the up going slope $S_{UP}$ and the down going slope $S_{DWN}$ to be controlled so that the level of the output signal $V_o$ just reaches the logic "high" or logic "low" level at the end of half a clock cycle. The level of the output signal $V_o$ will therefore easily reach a valid logic "high" or logic "low" level by the end of the clock cycle. This solution also simplifies the dimensioning of the first and the second comparators $CMP_1$, $CMP_2$. The modification is as follows: the fourth input of the logic and-gate AND must be connected to the input of the first inverter $IV_1$ instead of to the output of the first inverter $IV_1$; and the second input of the logic or-gate OR must be connected to the output of the first inverter $IV_1$ instead of to the input of the first inverter $IV_1$.

In FIG. 4 the effect of the above mentioned modification is shown. FIG. 4 should be compared with FIG. 2. The main difference is that the first slew rate control signal $V_{SLP}$ is only logic "high" when the level of the output signal $V_o$ is higher than the high reference level $RF_H$ and when the clock signal $V_{CLK}$ is at the same time logic "high" (in stead of logic "low" as in the case shown in FIG. 2).

The capacitor C may also be connected between the control electrode $TS_g$ and the second supply terminal 2 (in stead of the first supply terminal 1). This also holds for the further capacitor $C_A$. If appropriate, instead of discharging the capacitor (C, $C_A$) also charging the capacitor (C, $C_A$) may be interpreted. The transistors may be implemented by all kind of transistors. Also the logic gates of the control circuit CC and the evaluation means EVMNS may be implemented differently. In stead of the capacitive load $C_L$ connected between the output terminal OP and the first supply terminal 1 any kind of load may be coupled between the output terminal OP and the first supply terminal 1 and/or between the output terminal OP and the second supply terminal 2. The output stage can be constructed as an integrated circuit or also by means of discrete components.

What is claimed is:

1. An output stage comprising a first (1) and a second (2) supply terminal for receiving a supply voltage (SV); a pre-drive circuit (PDS) coupled to an input terminal (IP) for receiving an input signal ($V_i$), the pre-drive circuit (PDS) comprising a series transistor (TS) with a control electrode ($TS_g$) for receiving a control voltage ($V_{cntrl}$) for controlling a maximum current from an output ($PDS_{OUT}$) of the pre-drive circuit (PDS), and a capacitor (C) for retaining the control voltage ($V_{cntrl}$); an output-drive circuit (ODS) for delivering an output signal ($V_o$) at an output terminal (OP) in response to the input signal ($V_i$); and a control circuit (CC) for delivering the control voltage ($V_{cntrl}$), characterized in that the control circuit (CC) is directly coupled between the output terminal (OP) and the control electrode ($TS_g$).

2. An output stage as claimed in claim 1, characterized in that the control circuit (CC) comprises level detecting means (LDMNS) for delivering at least one digital signal dependent on a level of the output signal ($V_o$).

3. An output stage as claimed in claim 2, characterized in that the output stage comprises means (CLKMNS) for delivering a clock signal ($V_{CLK}$) during a first clock edge of the clock signal ($V_{CLK}$); and in that the control circuit (CC) comprises means ($Q_3,Q_4$) for adapting the control voltage ($V_{cntrl}$) in dependency of the at least one digital signal, the adapting of the control voltage ($V_{cntrl}$) being triggered by the first or a second clock edge of the clock signal ($V_{CLK}$).

4. An output stage as claimed in claim 3, characterized in that the pre-drive circuit (PDS) comprises means ($Q_5$) for discharging or charging the capacitor (C).

5. An output stage as claimed in claim 4, characterized in that the output stage comprises evaluation means (EVMNS) for delivering a digital evaluation signal (EVS) for avoiding the control voltage ($V_{cntrl}$) being adapted when the input signal ($V_i$) has not changed during a next clock cycle of the clock signal ($V_{CLK}$).

6. An output stage as claimed in claim 5, characterized in that the evaluation means (EVMNS) comprises a flip-flop (FF) with a data input ($D_{FF}$) for receiving the input signal ($V_i$), a clock input ($CLK_{FF}$) for receiving the clock signal ($V_{CLK}$), and an output ($Q_{FF}$) for delivering a delayed input signal ($V_{iDLD}$); and an exclusive or-gate (E) with a first input ($A_1$) for receiving the input signal ($V_i$), a second input ($A_2$) coupled to the output ($Q_{FF}$) of the flip-flop (FF), and an output ($Q_E$) fir delivering the digital evaluation signal (EVS).

7. An output stage as claimed in claim 3, characterized in that the output stage comprises evaluation means (EVMNS) for delivering a digital evaluation signal (EVS) for avoiding the control voltage ($V_{cntrl}$) being adapted when the input signal ($V_i$) has not changed during a next clock cycle of the clock signal ($V_{CLK}$).

* * * * *